United States Patent
Verbanets et al.

(10) Patent No.: US 9,664,712 B2
(45) Date of Patent: May 30, 2017

(54) MAGNETO OPTICAL CURRENT TRANSDUCER WITH IMPROVED OUTAGE PERFORMANCE

(75) Inventors: William Verbanets, Pittsburgh, PA (US); Michael Mendik, Claridge, PA (US)

(73) Assignee: ABB Schweiz AG, Baden (CH)

( * ) Notice: Subject to any disclaimer, the term of this patent is extended or adjusted under 35 U.S.C. 154(b) by 340 days.

(21) Appl. No.: 12/964,392

(22) Filed: Dec. 9, 2010

(65) Prior Publication Data

US 2011/0156695 A1 Jun. 30, 2011

Related U.S. Application Data

(60) Provisional application No. 61/285,803, filed on Dec. 11, 2009.

(51) Int. Cl.
| | | |
|---|---|---|
| G01R 13/38 | (2006.01) | |
| G01R 13/40 | (2006.01) | |
| G01R 15/24 | (2006.01) | |
| G01R 19/00 | (2006.01) | |
| G01R 21/00 | (2006.01) | |
| G01R 22/06 | (2006.01) | |

(52) U.S. Cl.
CPC .......... *G01R 15/245* (2013.01); *G01R 19/00* (2013.01); *G01R 21/00* (2013.01); *G01R 22/06* (2013.01)

(58) Field of Classification Search
CPC ....... G01R 15/245; G01R 21/00; G01R 22/06
USPC .......................................... 324/97, 96, 103 R
See application file for complete search history.

(56) References Cited

U.S. PATENT DOCUMENTS

| | | | | |
|---|---|---|---|---|
| 3,590,374 A | * | 6/1971 | Evans et al. ..................... | 324/66 |
| 4,578,639 A | | 3/1986 | Miller | |
| 4,811,605 A | * | 3/1989 | Nadeau .................. | G01N 29/14 73/583 |
| 4,999,569 A | * | 3/1991 | Weikel ................... | G01R 35/04 324/130 |
| 5,005,003 A | * | 4/1991 | Ryser ..................... | B01J 19/002 340/587 |
| 5,243,407 A | * | 9/1993 | King et al. .................... | 356/429 |
| 5,471,139 A | * | 11/1995 | Zadoff ........................ | 324/244.1 |
| 5,587,791 A | * | 12/1996 | Belleville et al. ............ | 356/483 |

(Continued)

FOREIGN PATENT DOCUMENTS

WO   2011072139 A1   6/2011

OTHER PUBLICATIONS

Himo M. et al: "Tests of optical fiber current transformer for direct currents", Power Electronics and Drive Systems, 2003, PEDS 2003. The Fifth International Conference on Singapore Nov. 17-20, 2003, Piscataway, Nj, USA, IEEE, Piscataway, NJ, USA, vol. 1, Nov. 17, 2003 pp. 284-286, XP010695110 DOI: 10.1109/PEDS.2003. 1282798 ISBN: 978-0-7803-7885-8 p. 285, col. 2, paragraph 1.

*Primary Examiner* — Giovanni Astacio-Oquendo
(74) *Attorney, Agent, or Firm* — Taft Stettinius & Hollister LLP

(57) ABSTRACT

A MOCT metering system includes a cutoff module that ensures zero output when values from an optical module fall below a threshold value. The cutoff module includes an RMS to DC converter that drives a comparator. The comparator drives a switch that causes the cutoff module to pass through the measured signal unmodified if above a threshold value and to output a zero voltage signal if below a threshold value.

9 Claims, 3 Drawing Sheets

(56) References Cited

U.S. PATENT DOCUMENTS

| | | | |
|---|---|---|---|
| 5,644,397 A * | 7/1997 | Blake | 356/483 |
| 5,654,799 A * | 8/1997 | Chase et al. | 356/600 |
| 5,726,628 A * | 3/1998 | Yoo | G01V 3/105 |
| | | | 324/239 |
| 5,747,985 A | 5/1998 | Lee et al. | |
| 5,790,293 A * | 8/1998 | Frigo | 398/33 |
| 5,987,195 A * | 11/1999 | Blake | G01R 33/0322 |
| | | | 385/12 |
| 6,188,811 B1 * | 2/2001 | Blake | 385/12 |
| 6,473,364 B1 * | 10/2002 | Koehn | H04B 11/00 |
| | | | 367/1 |
| 6,831,749 B2 * | 12/2004 | Terai et al. | 356/483 |
| 6,989,824 B1 * | 1/2006 | Ishii et al. | 345/204 |
| 7,113,708 B1 * | 9/2006 | Creaney | H04L 25/4917 |
| | | | 398/140 |
| 7,206,878 B2 * | 4/2007 | Smith | G06F 13/4068 |
| | | | 710/105 |
| 7,414,386 B2 * | 8/2008 | Lalonde | 324/76.11 |
| 7,583,898 B1 * | 9/2009 | Dalton et al. | 398/100 |
| 7,751,712 B2 * | 7/2010 | Zhao et al. | 398/72 |
| 8,077,298 B2 * | 12/2011 | Wang et al. | 356/73.1 |
| 8,939,031 B2 * | 1/2015 | Gross | 381/60 |
| 2003/0083584 A1 * | 5/2003 | Yonce | A61B 5/0424 |
| | | | 600/509 |
| 2006/0007192 A1 * | 1/2006 | De Smet et al. | 345/204 |
| 2006/0045459 A1 * | 3/2006 | Lalonde | G01M 11/00 |
| | | | 385/147 |

\* cited by examiner

MAGNETO OPTICAL CURRENT TRANSDUCER WITH IMPROVED OUTAGE PERFORMANCE

CROSS-REFERENCE TO RELATED APPLICATION

This application claims the benefit of U.S. provisional patent application No. 61/285,803 filed on Dec. 11, 2009 the contents of which are incorporated in their entirety.

BACKGROUND

As is known in the art, the plane of polarization of polarized light rotates in a magnetic field when the light is propagated in a direction parallel to the direction of the magnetic field. This phenomenon is utilized by magneto-optical current transducers (MOCT), to optically measure the current flowing through a conductor. MOCTs are commonly used in electricity metering systems, and in particular, in power distribution sub-stations. For example, U.S. Pat. No. 4,578,639 describes a metering system employing an MOCT, and is hereby incorporated by reference in it's entirety. Generally, the MOCT includes an optical source (typically an LED). The light is passed through a collimating lens and a polarizer. The polarized light then travels through an optical path comprising a dielectric material, around a current carrying conductor. The light source is received at a detector, which is commonly a silicon diode. The received signal may then be conditioned and amplified for output.

Though MOCTs are well accepted and have proven to be very reliable, some drawbacks persist. For example, some MOCT based meters tend to exhibit erroneous non-zero energy meter registration during power outages. Thus, there is a need in the art for an MOCT that does not exhibit non-zero energy registration during power outages.

SUMMARY OF THE INVENTION

According to one aspect of the present invention, a system for sensing current on a conductor and outputting to a meter is provided. The system includes an optical module including a light source for directing an optical signal in an optical path around the conductor and producing an optical module signal correlating to the current through the conductor. A cutout module receives the optical module signal and outputs a cutout module signal to the meter. The cutout module is adapted to output the optical module signal as the cutout module signal if the optical module signal is above a threshold value. The cutout module is adapted to output zero voltage as the cutout module signal if the optical module signal is below said threshold value.

DETAILED DESCRIPTION OF THE INVENTION

Figure 1:
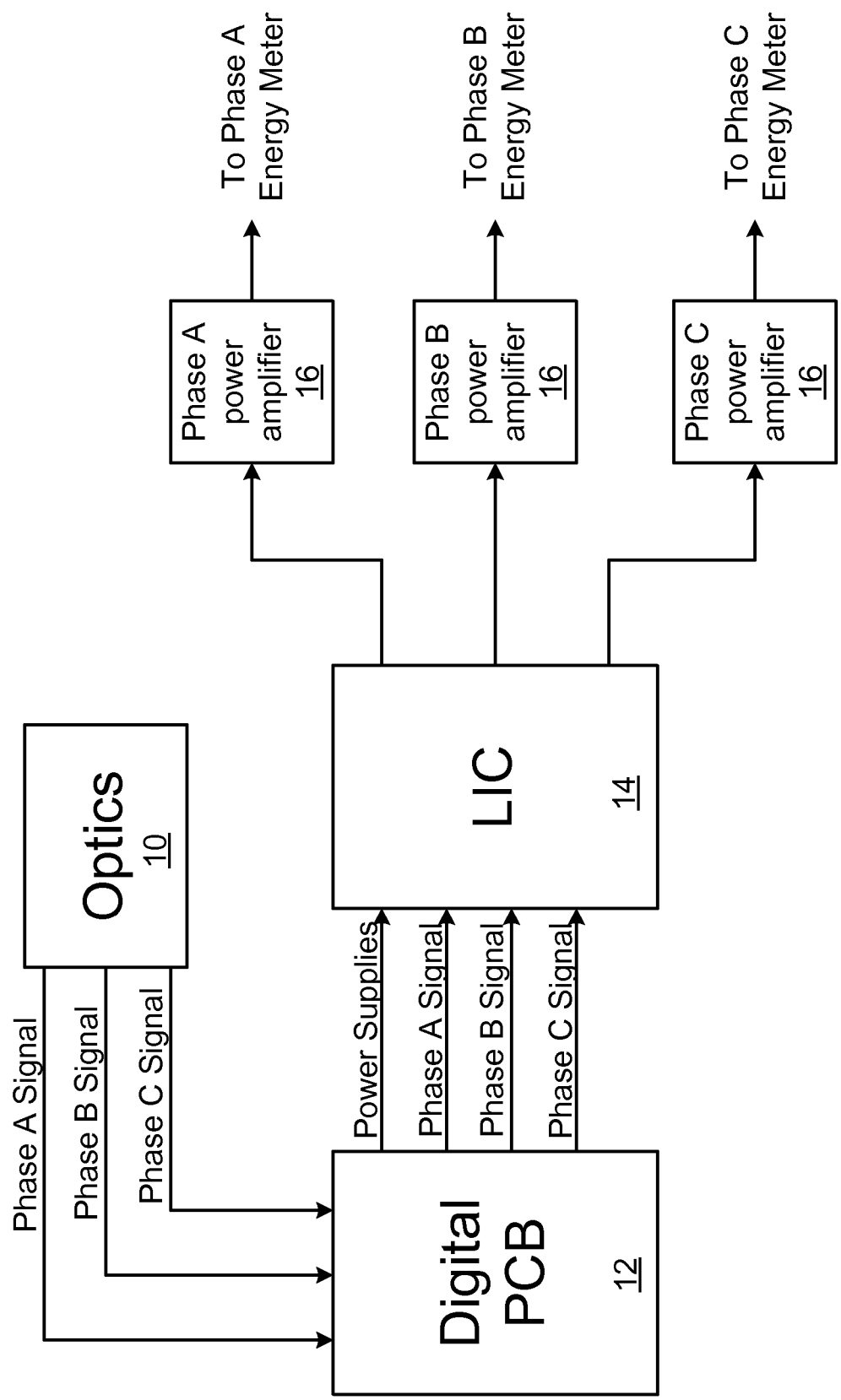
FIG. 1 is a function block schematic of an MOTC according to the present invention.

With reference now to FIG. 1, a function block schematic diagram of an sensor system according to the present invention is shown. The sensor system includes an optics module 10, a digital printed circuit board (PCB) 12, a low input cutout (LIC) module 14, and amplifiers 16 for each phase. The amplifiers 16 output to meters (not shown) which receive, store, output and/or display the data.

Figure 2:
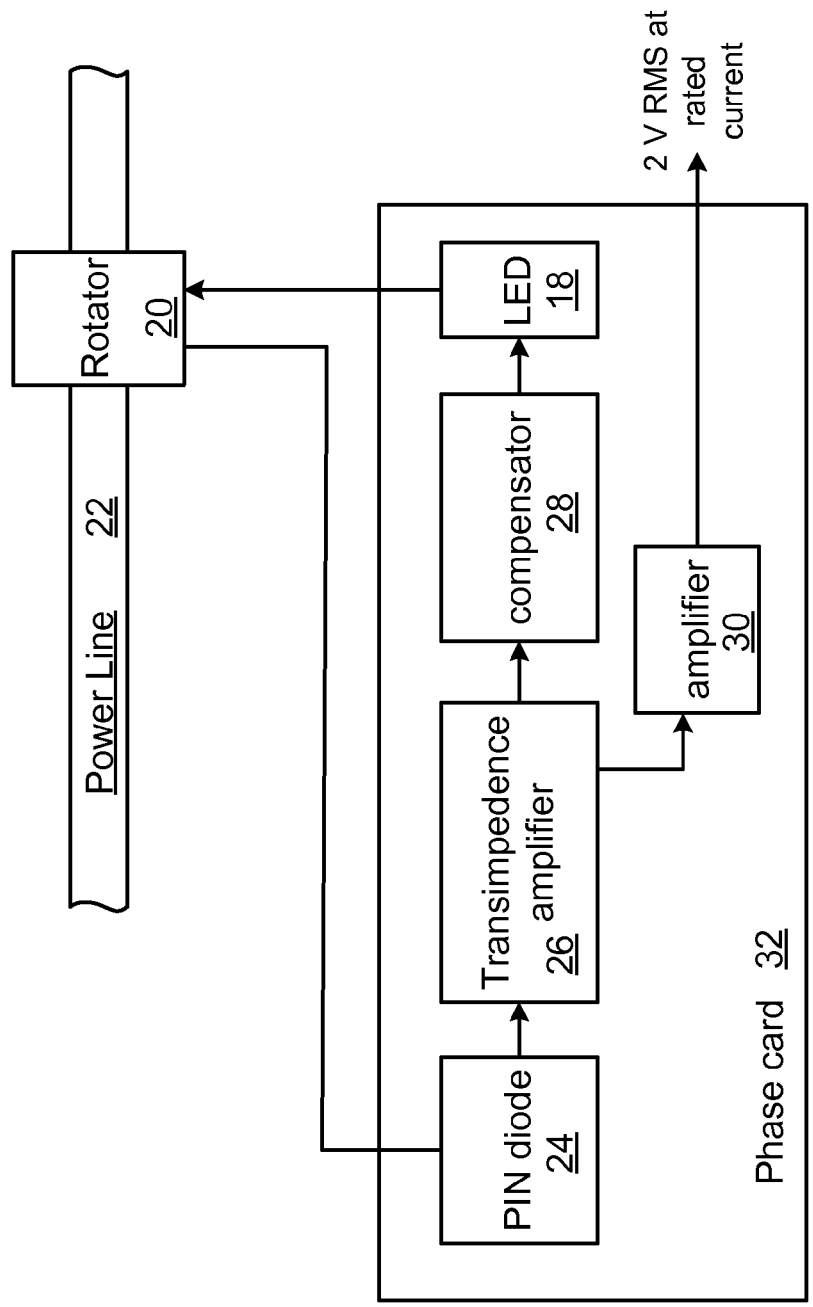
FIG. 2 is a function block schematic of the optics module for an MOTC according to the present invention.

With reference now to FIG. 2, the optics component 10 is shown. As discussed above, a polarized light source (LED 18) travels through an optical path (rotator 20) around a conductor 22 to be measured. The light is then received at a sensor (PIN diode 24) where the rotation of the polarized light is be measured. According to one exemplary embodiment, the polarized light is measured as a 60 Hz modulation of the input light intensity. The signal from PIN diode 24 is output to a transimpedance amplifier 26. The PIN diode converts light into electrons which creates a flow of current. The transimpedance amplifier converts the current to a voltage. The signal from the transimpedence amplifier 26 is output to a compensator 28. The intensity of the light is controlled by a feedback control system. The compensator keeps the light intensity loop stable, the output of which drives LED 18. The signal from the transimpedance amplifier 26 is also output to an amplifier 30. According to one embodiment, the amplifier 30 outputs a 2 volt RMS signal at rated current (of the power line to be monitored).

According to one embodiment, the pin diode 24, transimpedance amplifier 26, compensator 28, LED 18 and amplifier 30 each physically reside on a phase card 32. Meters incorporating an MOCT typically measure three phase power distribution, and thus three separate phase cards 32, performing three separate optical measurements (one on each phase), are used.

The signal from amplifier 30 from each phase card 32 is output to digital PCB 12. The digital PCB 12 outputs to the LIC module 14 the phase A, B, and C low level voltage signals that are proportional to the respective phase current. It should be appreciated, however, that digital PCB 12 functions merely as a pass-through or router of the signal from the optical module 10. Thus, the digital PCB 12 does not appreciably modify the signal. According to another embodiment, the output signal from optical module 10 may be directly connected to the LIC module 14.

Figure 3:
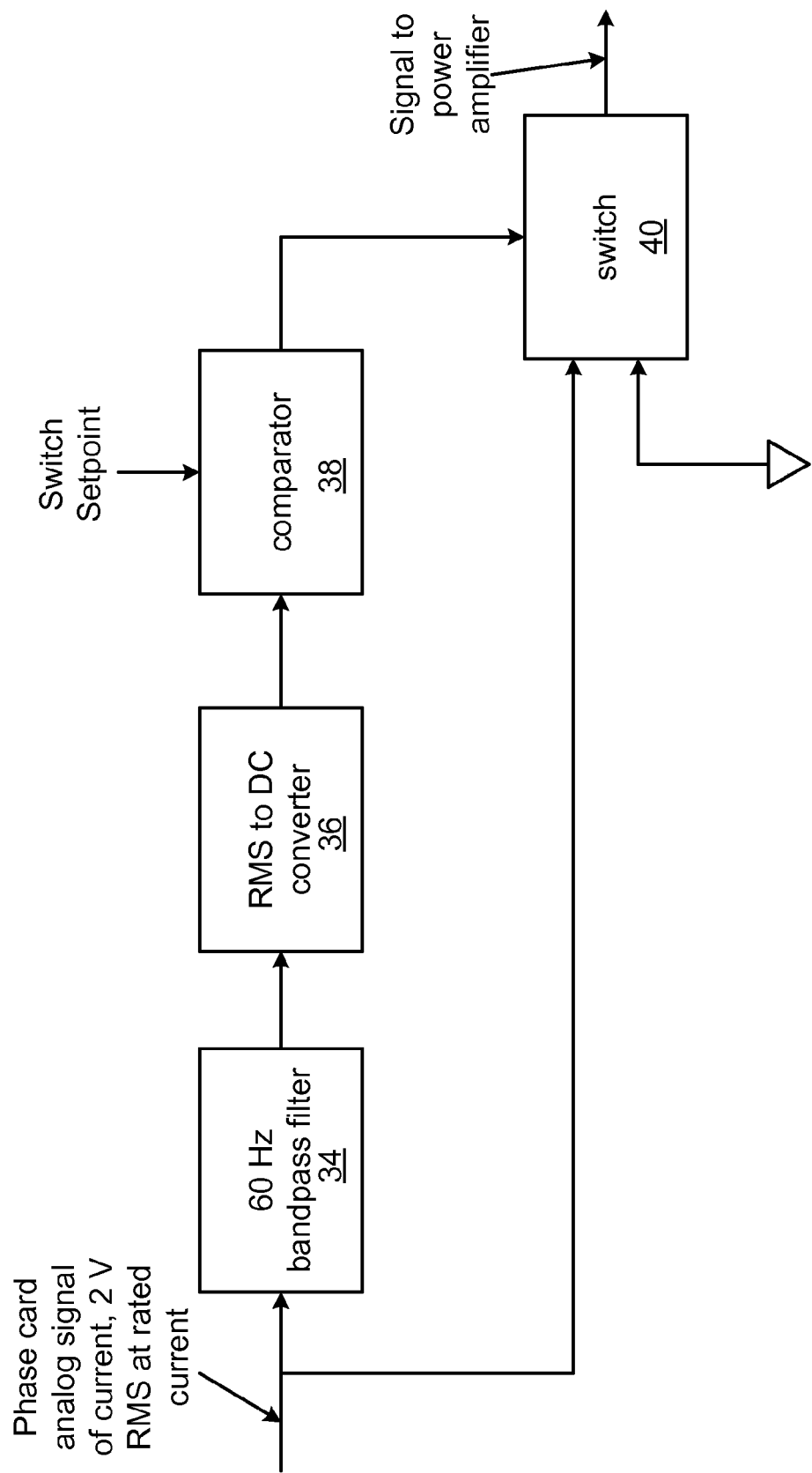
FIG. 3 is a function block schematic of the Low Input Cutout module according to the present invention.

With reference now to FIG. 3, the LIC module 14 includes three identical and independent circuits that continuously process the phase A, B, and C signals from optical module 10 (either received directly from the optical module 10 or through the digital PCB 12). Each LIC phase circuit outputs to an individual phase amplifier 16 which amplifies the signal and transmits it to the energy sensor or meter.

Each phase circuit in the LIC 14 includes a narrow band pass active filter 34. According to one embodiment, the filter 34 is set at 60 Hz with a Q equal to 12, which provides a ±5 Hz bandwidth (for power line 22 frequencies of 60 Hz). The band pass active filter may be adjusted to match the power line 22 frequency and may have Q values from 1 to 25. The output of the filter 34 drives an RMS to DC converter 36, which further filters the total RMS input into a DC value. The output of the RMS to DC converter 36 drives a comparator 38. The comparator 38 switches its output at a DC signal level corresponding to a minimum threshold value. According to one embodiment of the present invention, the threshold value is the DC signal corresponding to 0.5% of the rated phase current of power line 22. According to another embodiment the threshold value is the DC signal corresponding to 1% of the rated phase current of the power line 22. According to yet another embodiment the threshold value is the DC signal corresponding to 0.25% of the rated phase current of the power line 22.

The output of the comparator 38 controls a switch 40. At levels below the threshold value (in the first embodiment, 0.5% of the rated current), the switch 40 grounds the output to the power amplifier 16. At levels above the threshold value, the comparator 38 causes switch 40 to pass the phase voltage from the optical component 10 (as received directly or through the digital PCB 12) directly to the power amplifier 16 unmodified. Thus, at current levels above the threshold value, the LIC module 14 passes through the signal unmodified to the amplifiers 16. However, if current levels on the power line 22 drop below 0.5% of the rated current (indicating a power outage), the LIC module 14 ensures that zero output current is output from the power amplifier 16 to the meters. In this manner, erroneous energy meter registration is eliminated.

The wideband white noise present during a zero current condition at the input to the LIC module 14 has an approximate value of 5 mV RMS from DC for a 1 kHz 1000 A rated MOCT system. The narrowband filters 18 of the LIC module 14 reduce this noise level to approximately 0.5 mV RMS. If the rated current signal has an amplitude of 2 volts, for the exemplary embodiment wherein the threshold is 0.5% of rated current) the 0.5% rated current signal has an amplitude of 10 mV RMS. Therefore, the LIC module filtering yields an RMS signal to noise ratio of 20 and provides reliable switching at this level of input.

The present invention may be used in newly assembled MOCT based meters, or may take the form of a field upgrade kit for existing MOCT hardware, in particular, the ABB MOCT 2100I. According to this embodiment, the LIC module 14 may be in the form of a printed circuit board and mounted into the 2100I chassis directly above the preexisting digital PCB 12 using 1 inch standoffs supplied with a kit and the existing screw holes in the digital PCB 12. Cables supplied with the kit connect between the digital PCB, the LIC, and the power amplifier that produces the rated 1 A RMS current. Kit installation must be done while the 2100I chassis is de-energized.

According to one embodiment, the LIC PCB receives its power from the Digital PCB and requires approximately 150 mW of power from each of the "+" and "−" 15 V power supplies. Each power source has considerable head room to accommodate this increase in power and does not add a significant heat load to the interior of the 2100I chassis.

In the manner described above, the LIC PCB eliminates erroneous energy registration by utility revenue generating watt-hour meters during zero-current conditions.

As will be appreciated by one of ordinary skill in the art, various functions in the present invention may be embodied as or take the form of a computer readable medium having computer-readable instructions stored thereon which, when executed by a processor, carry out the operations of the present inventions as previously described. The computer-readable medium may be any medium that can contain, store, communicate, propagate, or transport the user-interface program instruction for use by or in connection with the instruction execution system, apparatus, or device and may by way of example but without limitation, be an electronic, magnetic, optical, electromagnetic, infrared, or semiconductor system, apparatus, device, or propagation medium or other suitable medium upon which the program is printed. More specific examples (a non-exhaustive list) of the computer-readable medium would include: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Computer program code or instructions for carrying out operations of the present invention may be written in any suitable programming language provided it allows achieving the previously described technical results.

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A system for sensing current through a conductor and outputting to a meter, the system comprising:
    an optical module including a light source for directing an optical signal in an optical path around the conductor and producing an optical module signal that is a voltage proportional to the current through the conductor; and,
    a cutout module including a number of circuits configured to receive said optical module signal that is the voltage proportional to the current through the conductor from the optical module and output a cutout module signal to the meter, wherein said cutout module is configured to convert a root mean squared (RMS) value of said optical module signal to a direct current (DC) signal, wherein said cutout module is further configured to output the cutout module signal as the optical module signal unmodified in response to said DC signal of the optical module signal being above a threshold value and said cutout module is further configured to output a zero voltage optical module signal in response to said DC signal being below the threshold value.

2. The system of claim 1 wherein said cutout module includes an RMS to DC converter configured to receive said optical module signal and output said DC signal to a comparator which controls a switch, said switch configured to receive as an input said optical module signal and output said optical module signal through a power amplifier at a switch output in response to said DC signal being above said threshold value.

3. The system of claim 2 wherein said comparator is configured to cause said switch to pass through said optical module signal through said power amplifier connected to said switch output in response to said DC signal being above said threshold value.

4. The system of claim 2 wherein said comparator is configured to cause said switch to ground said optical module signal at said power amplifier connected to said switch output in response to said DC signal being below said threshold value.

5. The system of claim 2 wherein said cutout module further comprises a band pass filter configured to filter said optical module signal before receipt by said RMS to DC converter.

6. The system of claim 1 wherein said threshold value of the optical module signal is 0.5% of the rated current of the conductor.

7. The system of claim 1 wherein said threshold value of the optical module signal is 0.25% of the rated current of the conductor.

8. The system of claim 1 wherein said threshold value of the optical module signal is 1% of the rated current of the conductor.

9. A system for sensing current through a conductor and outputting to a meter, the system comprising:

an optical module including a light source for directing an optical signal in an optical path around the conductor and producing an optical module signal that is a voltage proportional to the current through the conductor; and, a cutout module including a number of circuits configured to receive said optical module signal that is the voltage proportional to the current through the conductor from the optical module and output a cutout module signal to the meter, the cutout module further being configured to generate a DC signal having a value that is filtered from a root mean squared value of the optical module signal, the cutout module further being configured to output the cutout module signal as the optical module signal unmodified to an amplifier between the cutout module and the meter in response to the DC signal being above a threshold value, and output a zero voltage optical module signal in response to the DC signal being below the threshold value to eliminate erroneous energy registration from the conductor.

* * * * *